United States Patent
Lee et al.

(10) Patent No.: US 9,035,420 B2
(45) Date of Patent: May 19, 2015

(54) ORGANIC LIGHT EMITTING DEVICE, DISPLAY APPARATUS AND ILLUMINATION APPARATUS COMPRISING THE ORGANIC LIGHT EMITTING DEVICE, AND METHOD FOR PREPARING THE SAME

(71) Applicant: LG CHEM, LTD., Seoul (KR)

(72) Inventors: Jung Hyoung Lee, Daejeon (KR); Minsoo Kang, Daejeon (KR); Ducksu Oh, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 13/907,443

(22) Filed: May 31, 2013

(65) Prior Publication Data

US 2014/0034920 A1    Feb. 6, 2014

(30) Foreign Application Priority Data

May 31, 2012    (KR) ........................ 10-2012-0058922

(51) Int. Cl.
*H01L 23/52*    (2006.01)
*H01L 51/52*    (2006.01)

(52) U.S. Cl.
CPC ........ *H01L 51/5212* (2013.01); *H01L 51/5228* (2013.01); *H01L 2251/5361* (2013.01)

(58) Field of Classification Search
CPC ............ H01L 51/5203; H01L 51/5212; H01L 51/5228; H01L 27/3225; H01L 23/5256
USPC ....... 257/529, 88, 99, E33.064; 438/132, 215
See application file for complete search history.

(56) References Cited

U.S. PATENT DOCUMENTS

| 6,791,114 B2 * | 9/2004 | Shen ............................... 257/79 |
| 2005/0174064 A1 * | 8/2005 | Agostinelli et al. ....... 315/169.3 |
| 2013/0187186 A1 | 7/2013 | Popp |

FOREIGN PATENT DOCUMENTS

KR    20100123718 A    11/2010

* cited by examiner

*Primary Examiner* — Minh-Loan Tran
(74) *Attorney, Agent, or Firm* — McKenna Long & Aldridge LLP

(57) ABSTRACT

The present invention relates to an organic light emitting device and a method for preparing the same. An organic light emitting device according to the present invention comprises an organic light emitting unit having a structure in which a substrate, a first electrode, an organic material layer, and a second electrode are sequentially laminated, wherein the organic light emitting device comprises an auxiliary electrode and a fuse pattern; and the first electrode and the auxiliary electrode are electrically connected to each other through the fuse pattern.

16 Claims, 3 Drawing Sheets

The organic light emitting device may further comprise an internal light extraction layer between the substrate and the first electrode.

The organic light emitting device may further comprise an external light extraction layer on a surface opposing to a surface of the substrate on which the first electrode is provide.

The organic light emitting device may further comprise an internal light extraction layer between the substrate and the first electrode.

The organic light emitting device may further comprise an external light extraction layer on a surface opposing to a surface of the substrate on which the first electrode is provide.

The organic light emitting device may further comprise an internal light extraction layer between the substrate and the first electrode.

The organic light emitting device may further comprise an external light extraction layer on a surface opposing to a surface of the substrate on which the first electrode is provide.

ORGANIC LIGHT EMITTING DEVICE, DISPLAY APPARATUS AND ILLUMINATION APPARATUS COMPRISING THE ORGANIC LIGHT EMITTING DEVICE, AND METHOD FOR PREPARING THE SAME

TECHNICAL FIELD

This application claims priority from Korean Patent Application No. 10-2012-0058922, filed on May 31, 2012 at the KIPO, the disclosure of which is incorporated herein by reference in its entirety.

The present invention relates to an organic light emitting device and a method for preparing the same.

BACKGROUND ART

An organic light emitting device is formed of two opposite electrodes and thin films of organic materials having multi-layered semiconductor properties existing therebetween. The organic light emitting device of the above configuration uses a phenomenon where electric energy is converted into light energy by using an organic material, that is, an organic light emission phenomenon. In detail, in the structure where an organic material layer is disposed between an anode and a cathode, if a voltage is applied between two electrodes, holes are injected to the organic material layer in the anode and electrons are injected into the organic material layer in the cathode. When the injected holes and electrons meet each other, an exciton is formed, and the exciton falls down again to a bottom state to emit light.

In the above organic light emitting device, light that is generated in the organic material layer is discharged through a light transmissive electrode, and the organic light emitting device may be generally classified into a top emission type, a bottom emission type and a dual emission type. In the case of the top emission or bottom emission type, one of two electrodes needs to be a light transmissive electrode, and in the case of the dual emission type, both the two electrodes need to be a light transmissive electrode.

In respect to the organic light emitting device, many studies have been concentrated since Kodak, Co. Ltd. announced that in the case where the multilayer structure is used, driving at low voltage is implemented, and recently, a natural color display using the organic light emitting device is attached to a mobile phone and commercialized.

In addition, a study for the recent organic light emitting device using a phosphorescent material instead of a known fluorescent material has been made, such that efficiency has been rapidly improved, and it is expected that the device would be able to replace a known lighting in the near future.

In order to use the organic light emitting device as lighting, unlike a known natural color display, the device should be driven at high brightness, and a constant brightness should be maintained like a known lighting. In order to sufficiently improve brightness of the organic light emitting device, light emission should be implemented in a large area, and in order to implement light emission in the large area, a high driving current should be used. In addition, in order to maintain the constant brightness in the large area, the aforementioned high current needs to be uniformly injected into the device having the large area.

In general, as the anode material of the organic light emitting device, metal oxide having a large work function is mainly used. However, the electroconductivity of the metal oxide is not relatively high. Accordingly, in the case where the metal oxide is used in an organic EL or an LCD having a small display area, there is no problem, but in the case where the metal oxide is used in an organic EL having a large area for being used in lighting devices, a voltage drop by a high current is large, such that the current is not uniformly injected into a light emission surface, and therefore light emission of the device is not uniformly implemented. For example, light is emitted only in the vicinity of a portion in which an electrode is electrically connected to a driving circuit, and weak light emission or no light emission may occur in the other regions.

Meanwhile, as the cathode material of the organic light emitting device, metal having a small work function or an alloy thereof is mainly used. The above metal may have the high electroconductivity of the material, but in the case where transparency of the electrode is required because of characteristics of the organic light emitting device, if the electrode is formed of a thin film, the electroconductivity is decreased. Therefore, even in this case, since current is not uniformly injected onto a light emission surface, light emission of the device may not uniformly occur.

Therefore, in order to use the organic light emitting device as the lighting device, the light emission of high brightness needs to uniformly occur in the device having the large area by decreasing resistance of the electrode.

DETAILED DESCRIPTION OF THE INVENTION

Technical Problem

The present invention has been made in an effort to provide an organic light emitting device having a large area which comprises a fuse pattern in the organic light emitting device so as to automatically cut off the current so as to prevent excessive current with a defined value or higher from continuously flowing when a part of a light emission area is electrically short circuited.

Technical Solution

An exemplary embodiment of the present invention provides an organic light emitting device, comprising an organic light emitting unit having a structure in which a substrate, a first electrode, an organic material layer, and a second electrode are sequentially laminated, wherein the organic light emitting device comprises an auxiliary electrode and a fuse pattern; and the first electrode and the auxiliary electrode are electrically connected to each other through the fuse pattern.

Another exemplary embodiment of the present invention provides a method for preparing an organic light emitting device, comprising: 1) forming a first electrode on a substrate; 2) forming an auxiliary electrode on the substrate, 3) forming a fuse pattern which electrically connects the first electrode and the auxiliary electrode, and 4) forming an organic material layer and a second electrode.

Yet another exemplary embodiment of the present invention provides a method for preparing an organic light emitting device, comprising 1) forming a first electrode and a fuse pattern on a substrate, 2) forming an auxiliary electrode on the fuse pattern such that the first electrode and the auxiliary electrode are electrically connected to each other through the fuse pattern, and 3) forming an organic material layer and a second electrode.

Advantageous Effects

The organic light emitting device according to the present invention comprises the fuse pattern which electrically connects the first electrode and the auxiliary electrode of the first electrode so that when eddy current is generated in a specific organic light emitting unit, the fuse pattern is automatically cut off so as to prevent the entire organic light emitting device from being electrically short circuited.

DESCRIPTION OF MAIN PARTS OF DRAWINGS

Figure 1:
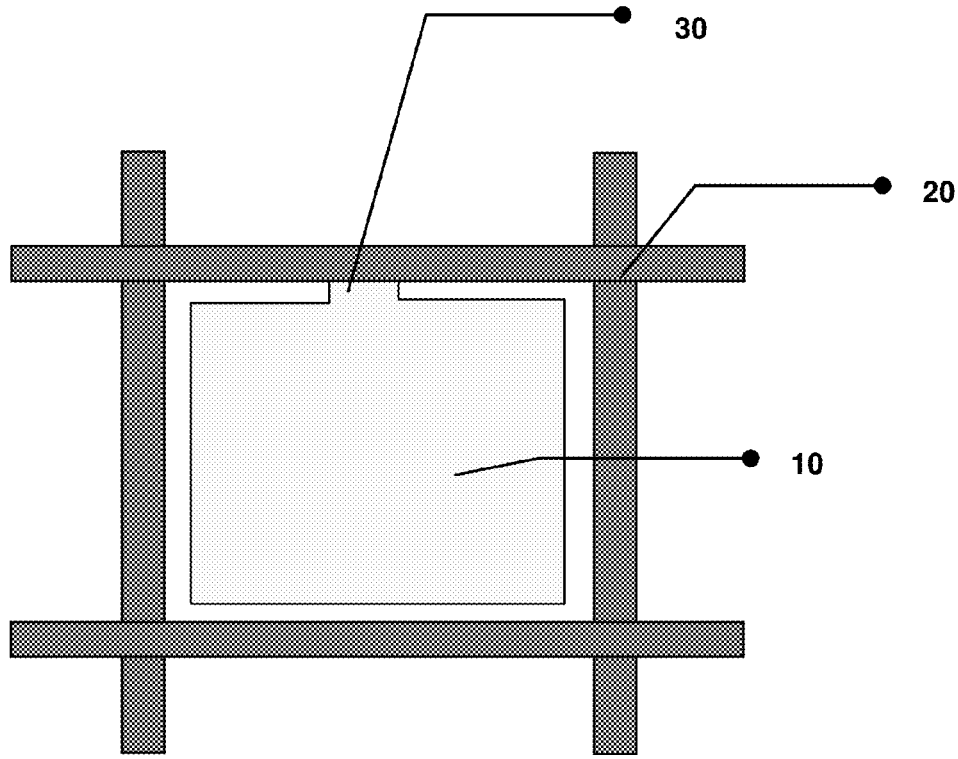
FIG. 1 is a diagram illustrating that a first electrode and an auxiliary electrode of an organic light emitting device according to a specific embodiment of the present invention are electrically connected to each other through a fuse pattern.

10: First electrode
20: Auxiliary electrode
30: Fuse pattern

BEST MODE

Hereinafter, the present invention will be described in detail.

In general, an organic light emitting device has a structure in which two electrodes having a large area face each other and an organic material layer that emits light by a current is formed therebetween. The current is applied at an edge of the electrode, flows toward the center of the electrode, passes through an organic material, and is discharged to an electrode facing the above electrode, and in this case, a voltage drop occurs in proportion to resistance of the electrode while the current flows to the center of the electrode at the edge thereof. Since energy is consumed as much as the voltage drop which occurs due to the resistance of the electrode, energy efficiency of the organic light emitting device is reduced.

In addition, since an electric field formed between two electrodes varies, an amount of emitted light of an organic material varies according to a position of the electrode, and a difference in brightness according to the position thereof is not good in terms of an appearance and negatively affects stability of the device. Therefore, in the organic light emitting device, a design for minimizing these problems is needed.

A transparent electrode used in the organic light emitting device is transparent so as to allow the light to be transmitted, but has very high electrical resistance compared to a metal electrode. Therefore, when the organic light emitting device is intended to be implemented in a large area, the voltage distribution within the large light emission area is not uniform due to the high electrical resistance of the transparent electrode, and accordingly, there is a problem in obtaining light emission with uniform brightness in a large area. A method generally used in order to solve the problem is to install an auxiliary electrode using metal on or under the transparent electrode. A metal auxiliary electrode is manufactured with a lattice shape as thin as possible in order to secure transparency, and a method of increasing the cycle of the lattice as long as possible is used in order to increase transparency while obtaining a uniform voltage distribution in a large area. However, the method of using a metal auxiliary electrode with a lattice shape has not only a problem in that complexity of the process increases, but also a process problem in that when an auxiliary electrode is formed on a transparent electrode, it is difficult to uniformly stack an organic material to be configured on the auxiliary electrode due to the height thereof.

Further, in an organic light emitting device having a large area comprising a plurality of organic light emitting pixels, when a defect such as electrical short-circuit occurs due to the eddy current which flows in a part of a plurality of organic light emitting pixels, the entire organic light emitting device having a large area may be defected.

The present invention has been made in an effort to provide an organic light emitting device having a large area which comprises a fuse in the organic light emitting device so as to automatically cut off the current so as to prevent excessive current with a defined value or higher from continuously flowing when a part of a light emission area is electrically short circuited.

An organic light emitting device according to the present invention comprises an organic light emitting unit having a structure in which a substrate, a first electrode, an organic material layer, and a second electrode are sequentially laminated, wherein the organic light emitting device comprises an auxiliary electrode and a fuse pattern; and the first electrode and the auxiliary electrode are electrically connected to each other through the fuse pattern.

In the organic light emitting device according to the present invention, as the substrate, a substrate which is widely known in the art may be used without any limitation. More specifically, a hard substrate such as glass, $SiO_2$, and a silicon wafer, or a film substrate such as polyethylene terephthalate (PET), polycarbonate (PC), polyimide (PI), polyethylene naphthalate (PEN), and cycloolefin polymer (COP) may be used, but the substrate is not limited thereto.

In the organic light emitting device according to the present invention, the first electrode may be a transparent electrode and the second electrode may be a metal electrode.

More specifically, the first electrode may comprise a transparent conductive material such as indium tin oxide (ITO), IZO, ZnO, and $SnO_2$, but is not limited thereto.

The first electrode may be formed by depositing metal, metal oxide having conductivity, an alloy thereof, and the like on a substrate using a physical vapor deposition (PVD) method such as sputtering or e-beam evaporation.

In the organic light emitting device according to the present invention, the second electrode may be a metal electrode. The metal may comprise at least one of Al, Ag, Ca, Mg, Au, Mo, Ir, Cr, Ti, Pd, and an alloy thereof, but is not limited thereto.

In the organic light emitting device according to the present invention, the auxiliary electrode is for improving the resistance of the first electrode, and may be formed by depositing one or more selected from the group consisting of a conductive sealant and metal. More specifically, the auxiliary electrode may comprise Cr, Mo, Al, Cu, or an alloy thereof, but is not limited thereto.

In the organic light emitting device according to the present invention, the fuse pattern may be formed of metal whose melting point is lower than those of the first electrode and the auxiliary electrode. Further, the fuse pattern may comprise the same material as a material of the first electrode.

More specifically, the fuse pattern may comprise one or more of indium tin oxide (ITO), IZO, ZnO, $SnO_2$, Ca, Mg, and Indium, but is not limited thereto.

In the organic light emitting device according to the present invention, the first electrode has a quadrangular shape comprising four sides on a plan view and at least one of the four sides may be electrically connected to the auxiliary electrode through the fuse pattern.

When the fuse pattern comprises the same material as that of the first electrode, a width and a length of the fuse pattern are preferably 10 to 100 μm, respectively, but are not limited thereto.

Further, when the fuse pattern comprises a different material from that of the first electrode, a width and a length of the fuse pattern are preferably 20 to 300 μm, respectively, but are not limited thereto.

The organic light emitting device according to the present invention may be applied to an organic light emitting device for illumination, but is not limited thereto.

The organic light emitting device according to the present invention comprises the fuse pattern which electrically connects the first electrode and the auxiliary electrode of the first electrode so that when eddy current is generated in a specific organic light emitting unit, the fuse pattern is automatically cut off so as to prevent the entire organic light emitting device from being electrically short circuited.

Further, when a white spot of the organic light emitting device is generated, if an abnormality occurs after turning off the organic light emitting device, a fuse pattern of the specific organic light emitting unit in which abnormality occurs is easily electrically cut using laser cutting.

In the organic light emitting device according to the present invention, the organic material layer may be manufactured in the smaller number of layers by not only a deposition method using various polymer materials and but also methods such as a solvent process, for example, spin coating, dip coating, doctor blading, screen printing, inkjet printing, a heat transferring method and the like.

The organic material layer may have a laminate structure that comprises a light emitting layer, and further comprises one or more selected from a hole injection layer, a hole transport layer, an electron transport layer, and an electron injection layer.

As a material capable of forming the hole injection layer, in general, a material having a large work function is preferred such that the injection of holes into the organic material layer may be facilitated. Specific examples of the hole injection material which may be used in the present invention comprise metal, such as vanadium, chromium, copper, zinc and gold, or alloys thereof; metal oxide, such as zinc oxide, indium oxide, indium tin oxide (ITO) and indium zinc oxide (IZO); a combination of metal and oxide, such as $ZnO:Al$ or $SnO_2:Sb$; an electrically conductive polymer, such as poly(3-methylthiophene), poly[3,4-(ethylene-1,2-dioxy)thiophene](PEDT), polypyrrole and polyaniline, and the like, but are not limited thereto.

As a material capable of forming the electron injection layer, in general, a material having a small work function is preferred such that electrons are easily injected into the organic material layer. As detailed examples of the electron injection material, there are metal such as magnesium, calcium, sodium, potassium, titanium, indium, yttrium, lithium, gadolinium, aluminum, silver, tin, and lead or an alloy thereof; and a multilayered structure material such as LiF/Al or $LiO_2/Al$, and the same material as the hole injection electrode material may also be used, but they are not limited thereto.

A material capable of forming the light emitting layer is a material that is capable of emitting light in a visible ray region by accepting and combining holes from the hole transport layer and electrons from the electron transport layer, respectively, and is preferably a material having high quantum efficiency for fluorescence or phosphorescence. As detailed examples thereof, there are a 8-hydroxy-quinoline aluminum complex ($Alq_3$); a carbazole-based compound; a dimerized styryl compound; BAlq; 10-hydroxybenzoquinoline-metal compound; a benzoxazole, benzthiazole and benzimidazole-based compound; a poly(p-phenylenevinylene) (PPV)-based polymer; a spiro compound; polyfluorene, lubrene; and phosphorescent host CBP [[4,4'-bis(9-carbazolyl)biphenyl], but they are not limited thereto.

In addition, the light emitting material may further comprise a phosphorescent dopant or a fluorescent dopant in order to improve fluorescent or phosphorescent characteristics. As detailed examples of the phosphorescent dopant, there are ir(ppy)3(fac tris(2-phenylpyridine) iridium) or F2Irpic[iridium(III)bis[4,6,-di-fluorophenyl-pyridinato-N,C2) picolinate]. As the fluorescent dopant, materials known in the art may be used.

As a material capable of forming the electron transport layer, a material which may receive electrons from the electron injection layer well and transport the electrons to the light emitting layer and has high mobility to electrons is suitable. Specific examples thereof comprise a 8-hydroxyquinoline Al complex; a complex comprising $Alq_3$; an organic radical compound; a hydroxyflavone-metal complex, and the like, but are not limited thereto.

The organic light emitting device according to the present invention may further comprise an insulating layer pattern on the substrate. The insulating layer pattern may serve as a pixel division in the organic light emitting device having a large area and may be formed using materials and methods known in the art.

Specific example of the method for preparing an organic light emitting device according to the present invention comprises 1) forming a first electrode on a substrate, 2) forming an auxiliary electrode on the substrate, 3) forming a fuse pattern which electrically connects the first electrode and the auxiliary electrode, and, and 4) forming an organic material layer and a second electrode.

In the method for preparing an organic light emitting device according to the present invention, the fuse pattern in 3) the forming of a fuse pattern may comprise metal whose melting point is lower than those of the first electrode and the auxiliary electrode.

More specifically, the fuse pattern may comprise one or more of indium tin oxide (ITO), IZO, ZnO, $SnO_2$, Ca, Mg, and indium, but is not limited thereto.

Another specific example of the method for preparing an organic light emitting device according to the present invention comprises 1) forming a first electrode and a fuse pattern on a substrate, 2) forming an auxiliary electrode on the fuse pattern such that the auxiliary electrode is electrically connected to the first electrode through the fuse pattern, and 3) forming an organic material layer and a second electrode In the method for preparing an organic light emitting device according to the present invention, when the first electrode is formed in the 1) step, a length, a width, and a shape of the first electrode are adjusted to form the fuse pattern having the same material as the first electrode together.

Hereinafter, the present invention will be described in detail with reference to the drawings.

Figure 2:
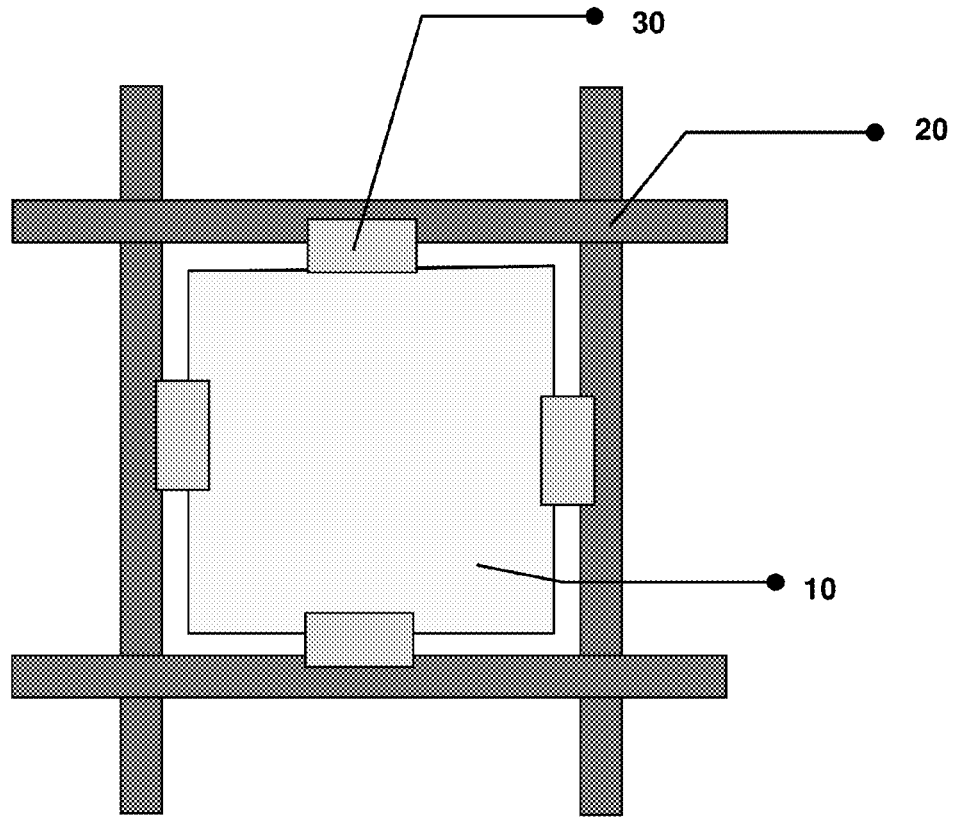
FIG. 2 is a diagram illustrating that a first electrode and an auxiliary electrode of the organic light emitting device according to a specific embodiment of the present invention are electrically connected to each other through a fuse pattern.

FIGS. 1 and 2 are diagrams illustrating that a first electrode and an auxiliary electrode of the organic light emitting device according to a specific embodiment of the present invention are electrically connected to each other through a fuse pattern.

FIG. 1 illustrates an organic light emitting device in which a first electrode 10 and a fuse pattern 30 are formed of the same material and the first electrode 10 and an auxiliary electrode 20 are electrically connected through the fuse pattern 30. The fuse pattern 30 may be formed by adjusting a length, a width, and a shape of the first electrode 10 when forming the first electrode 10.

FIG. 2 illustrates an organic light emitting device in which the fuse pattern 30 is formed on the first electrode 10 and the auxiliary electrode 20 and the first electrode 10 and the auxiliary electrode 20 are electrically connected through the fuse pattern 30. The fuse pattern 30 may be formed of metal whose melting point is lower than those of the first electrode 10 and the auxiliary electrode 20 using a deposition process.

Figure 3:
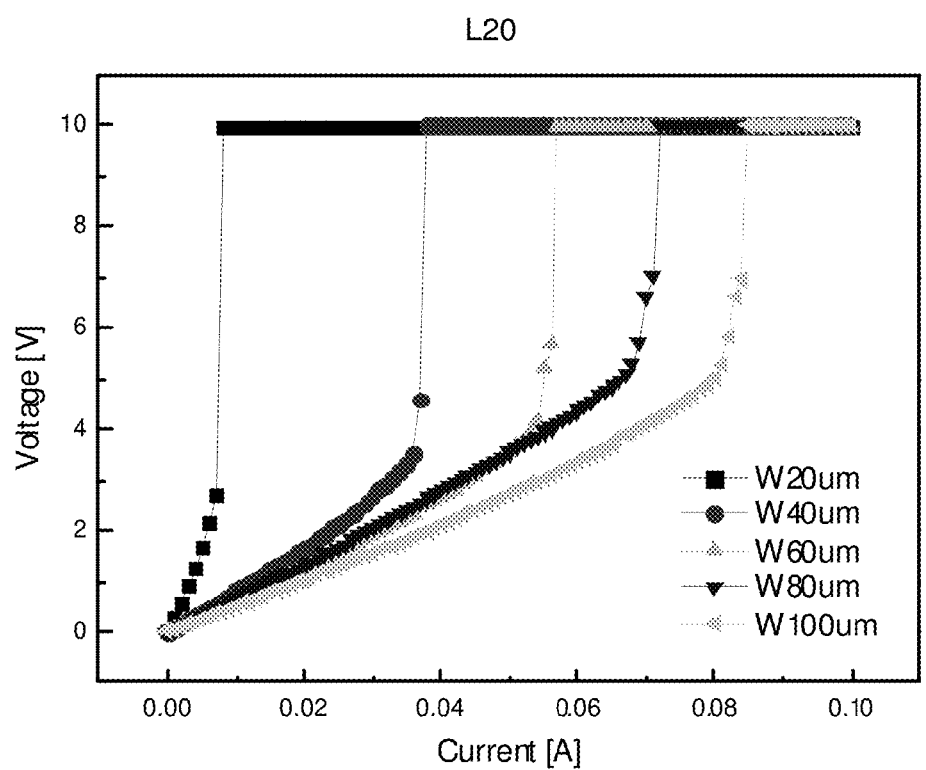
FIG. 3 is a diagram illustrating a short-circuit current and a resistance value in accordance with a size of the fuse pattern according to the present invention.

FIG. 3 is a diagram illustrating a short-circuit current and a resistance value in accordance with a size of the fuse pattern according to the present invention. More specifically, FIG. 3 illustrates a current value at which the fuse is cut off when a width of the fuse pattern is adjusted while constantly maintaining the length of the fuse pattern. It is known that when the length is 20 μm and the width is 10 μm, the fuse pattern is cut off at 0.01 A. Therefore, it is possible to set a current limit where the fuse pattern is cut off in accordance with a change in the resistance value.

The organic light emitting device according to the present invention may comprise a light extraction structure.

In the present invention, the organic light emitting device may further comprise an internal light extraction layer between the substrate and the first electrode. Further, the organic light emitting device may further comprise an external light extraction layer on a surface opposing to a surface of the substrate on which the first electrode is provided.

In the present invention, the internal light extraction layer or the external light extraction layer is not particularly limited as long as the layer has a structure in which light scattering may be induced to improve the light extraction efficiency of the organic light emitting device. More specifically, the light extraction layer may have a structure in which scattering particles are dispersed in a binder.

In addition, the light extraction layer may be directly formed on the base member by a method such as spin coating, bar coating, slit coating, and the like, or may be formed by a method of preparing the layer in a film form to be attached on the base member.

In the present invention, the organic light emitting device is a flexible organic light emitting device. In this case, the base member comprises a flexible material. For example, it is possible to use glass having a flexible thin film form, and a substrate having a plastic or film form.

A material of the plastic substrate is not particularly limited, but generally, a film of PET, PEN, PI, and the like may be used in the form of a single layer or plural layers.

Furthermore, the present invention provides a display apparatus comprising the organic light emitting device.

Further, the present invention provides an illumination apparatus comprising the organic light emitting device.

As described above, the organic light emitting device according to the present invention comprises the fuse pattern which electrically connects the first electrode and the auxiliary electrode of the first electrode so that when eddy current is generated in a specific organic light emitting unit, the fuse pattern is automatically cut off so as to prevent the entire organic light emitting device from being electrically short circuited.

The invention claimed is:

1. An organic light emitting device comprising an organic light emitting unit having a structure in which a substrate, a first electrode, an organic material layer, and a second electrode are sequentially laminated, wherein the organic light emitting device comprises an auxiliary electrode and a fuse pattern;

wherein the first electrode and the auxiliary electrode are electrically connected to each other through the fuse pattern;

wherein the auxiliary electrode comprises one or more selected from the group consisting of Cr, Mo, Al, Cu, and an alloy thereof; and wherein the fuse pattern comprises one or more selected from a group consisting of indium tin oxide (ITO), IZO, ZnO, $SnO_2$, Ca, Mg, and indium.

2. The organic light emitting device of claim 1, wherein the substrate is selected from a group consisting of glass, $SiO_2$, and a silicon wafer, polyethylene terephthalate (PET), polycarbonate (PC), polyimide (PI), polyethylene naphthalate (PEN), and cycloolefin polymer (COP).

3. The organic light emitting device of claim 1, wherein the first electrode is a transparent electrode and the second electrode is a metal electrode.

4. The organic light emitting device of claim 1, wherein the first electrode comprises one or more selected from a group consisting of indium tin oxide (ITO), IZO, ZnO, and $SnO_2$.

5. The organic light emitting device of claim 1, wherein the second electrode comprises one or more selected from a group consisting of Al, Ag, Ca, Mg, Au, Mo, Ir, Cr, Ti, Pd, and an alloy thereof.

6. The organic light emitting device of claim 1, wherein the first electrode and the fuse pattern comprise the same material.

7. The organic light emitting device of claim 1, wherein the first electrode has a quadrangular shape comprising four sides on a plan view and at least one of the four sides is electrically connected to the auxiliary electrode.

8. The organic light emitting device of claim 1, wherein the fuse pattern comprises the same material as the first electrode, and a width and a length of the fuse pattern are 10 to 100 μm, respectively.

9. The organic light emitting device of claim 1, wherein the fuse pattern comprises the different material from that of the first electrode, and a width and a length of the fuse pattern are 20 to 300 μm, respectively.

10. The organic light emitting device of claim 1, further comprising:

an internal light extraction layer between the substrate and the first electrode or an external light extraction layer on a surface opposing to a surface of the substrate on which the first electrode is provided.

11. The organic light emitting device of claim 1, wherein the organic light emitting device is a flexible organic light emitting device.

12. A display apparatus comprising an organic light emitting device of claim 1.

13. An illumination apparatus comprising an organic light emitting device of claim 1.

14. A method for preparing an organic light emitting device, the method comprising:

1) forming a first electrode on a substrate;
2) forming an auxiliary electrode on the substrate;
3) forming a fuse pattern which electrically connects the first electrode and the auxiliary electrode, and
4) forming an organic material layer and a second electrode, wherein the auxiliary electrode in 2) comprises one or more selected from the group consisting of Cr, Mo, Al, Cu, and an alloy thereof, and wherein the fuse pattern in 3) comprises one or more selected from a group consisting of indium tin oxide (ITO), IZO, ZnO, $SnO_2$, Ca, Mg, and indium.

15. A method for preparing an organic light emitting device, the method comprising:
1) forming a first electrode and a fuse pattern on a substrate,
2) forming an auxiliary electrode on the fuse pattern such that the first electrode and the auxiliary electrode are electrically connected to each other through the fuse pattern, and
3) forming an organic material layer and a second electrode,
wherein the auxiliary electrode in 2) comprises one or more selected from the group consisting of Cr, Mo, Al, Cu, and an alloy thereof, and
wherein the fuse pattern in 3) comprises one or more selected from a group consisting of indium tin oxide (ITO), IZO, ZnO, $SnO_2$, Ca, Mg, and indium.

16. The method of claim 15, wherein the first electrode and the fuse pattern comprise the same material.

* * * * *